(12) United States Patent
Chang et al.

(10) Patent No.: US 6,455,890 B1
(45) Date of Patent: Sep. 24, 2002

(54) STRUCTURE OF FABRICATING HIGH GATE PERFORMANCE FOR NROM TECHNOLOGY

(75) Inventors: Kent Kuohua Chang; Jen-Yuan Chiu, both of Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/945,795

(22) Filed: Sep. 5, 2001

(51) Int. Cl.[7] .............................................. H01L 29/788
(52) U.S. Cl. ...................... 257/321; 257/315; 257/316; 257/324; 257/326
(58) Field of Search ................... 257/321, 314, 257/324, 315, 316, 325; 438/201, 263, 264, 216, 261, 211, 257, 260, 593, 594; 365/151, 182

(56) References Cited

U.S. PATENT DOCUMENTS

| | | | | |
|---|---|---|---|---|
| 6,153,470 A | * | 11/2000 | He et al. ..................... | 438/257 |
| 6,320,784 B1 | * | 11/2001 | Muralidhar et al. ......... | 365/151 |
| 6,344,403 B1 | * | 2/2002 | Madhukar et al. .......... | 438/503 |

FOREIGN PATENT DOCUMENTS

| | | | | |
|---|---|---|---|---|
| JP | 408153808 A | * | 6/1996 | ....... H01L/21/8247 |

* cited by examiner

*Primary Examiner*—Steven Loke
*Assistant Examiner*—Shouxiang Hu

(57) ABSTRACT

A structure of fabricating high gate performance for NROM technology. The method at least includes the following steps. First of all, a tunnel oxide layer on the silicon substrate. Then, a amorphous silicon layer on the tunnel oxide layer, and a poly-SiGe layer (a polysilicon layer with doped germanium) on the amorphous silicon layer. Next, an interpoly dielectric layer on the poly-SiGe layer. Finally, a polysilicon layer on the interpoly dielectric layer.

13 Claims, 4 Drawing Sheets

STRUCTURE OF FABRICATING HIGH GATE PERFORMANCE FOR NROM TECHNOLOGY

BACKGROUND OF THE INVENTION

1. Field of the Invention

The present invention generally relates to a structure for forming a semiconductor device, and more particularly to a structure of fabricating high gate performance for NROM technology.

2. Description of the Prior Art

Semiconductor devices typically include multiple individual components formed on or within a substrate. As illustrated in prior art FIG. 1A, a memory device such as a flash memory 100 comprises one or more memory arrays 102 and peripheral regions 104 on a substrate 106. The memory array 102 typically consists of at least one MXN array of individually addressable, substantially identical floating-gate type memory cells and the peripheral region 104 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the array 102 are coupled together in an NAND-type circuit configuration, such as, for example, the configuration illustrated in prior art FIG. 1B. Each memory cell 108 has a drain 108a, a source 108b and a stacked gate 108c. A plurality of memory cells 108 connected together in series with a drain select transistor at one end and a source select transistor at the other end to form a NAND string as illustrated in prior art FIG. 1B. Each stacked gate 108c is coupled to a word line (WL0, WL1, ..., WLn) while each drain of the drain select transistors are coupled to a bit line (BL0, BL1, ..., BLn). Lastly, each source of the source select transistors are coupled to a common source line Vss. Using peripheral decoder and control circuitry, each memory cell 108 can be addressed for programming, reading or erasing functions.

Prior art FIG. 1C represents a fragmentary cross section diagram of a typical memory cell 108 in the array 102 of prior art FIGS. 1A and 1B. Such a cell 108 typically includes the source 108b, the drain 108a and a channel 110 in a substrate or P-well 112; and the stacked gate structure 108c overlying the channel 110. The stacked gate 108c further includes a thin gate dielectric layer 114a (commonly referred to as the tunnel oxide) formed on the surface of the P-well 112. The stacked gate 108c also includes a polysilicon floating gate 114b which overlies the tunnel oxide 114a and an interpoly dielectric layer 114c overlies the floating gate 114b. The interpoly dielectric layer 114c is often a multilayer insulator such as an oxide-nitride-oxide (ONO) layer having two oxide layers sandwiching a nitride layer. Lastly, a polysilicon control gate 114d overlies the interpoly dielectric layer 114c. The control gates 114d of the respective cells 108 that are formed in a lateral row (see, for example, prior art FIG. 1B). In addition, the drain regions 108a of the respective cells in a vertical column are connected together by a conductive bit line (BL). The channel 110 of the cell 108 conducts current between the source 108b and the drain 108a in accordance with an electric field developed in the channel 110 by the stacked gate structure 108c.

The process for making such NAND type flash memory devices includes numerous individual processing steps. There are numerous concerns associated with making flash memory devices that provide consistent performance and reliability. For example, the thicker the floating gate, the more likely undesirable cracking occurs in the tungsten silicide layer and the more likely etch problems occur due to high aspect ratios and high topographies. However, the thicker the floating gate, higher the stress released on the tunnel oxide layer, improved tunnel oxide reliability, improved conductivity and better circuit performance result. The thinner the floating gate, the more likely undesirable punch through during etch occurs, especially the Poly 1 contact etch for the select gate, as well as an undesirable increase in pinhole defects. Further, when the thickness of the Poly 1 is too thin, an HF dip cleaning step (prior to forming the ONO multilayer dielectric film) may degrade the Poly 1 and attack the tunnel oxide.

If the doping level is too low in the control gate, wordline resistance and contact resistance become undesirably high, and specifically resistivity for the select gate becomes undesirably high. However, low doping in floating gate results in a smooth tunnel oxide-floating gate interface. Low doping also results in fewer charge gain (loss) problems. If the doping level is too high in the floating gate, undesirable dopant segregation to the tunnel oxide occurs, undermining the tunnel oxide integrity. Undesirably high doping levels lead to severe surface roughness between the floating gate and the tunnel oxide, resulting in high local electric fields, lower oxide dielectric strength, and program/erase endurance cycling problems.

The prior art defect of the poly gate has depletion effect, and less dopant activation, weak reliability interface between polysilicon/oxide or poly-SiGe/$SiO_2$, and low gate oxide integrity.

For the forgoing reasons, there is a necessary structure of fabricating high gate performance for NROM technology.

SUMMARY OF THE INVENTION

The present invention is directed toward a structure of fabricating high gate performance for NROM. The key aspect of the present invention is that the Poly-SiGe layer is to replace conventional polysilicon layers for the floating gate and control gate in the array and peripheral regions. The amorphous silicon layer is deposited on the silicon oxide layer, and the Poly-SiGe layer is deposited on the amorphous silicon layer, wherein the amorphous silicon layer is formed with doped germanium in the polysilicon layer which is the Poly-SiGe layer formed ways. After activation annealing (S/D anneal), germanium diffuses into the polysilicon layer and amorphous silicon layer to avoid germanium diffusion into silicon oxide layer. Therefore amorphous silicon layer became polysilicon layer by annealing. This thin amorphous silicon layer improves the gate oxide quality such as breakdown voltage.

In accordance with the present invention, a structure of fabricating high gate performance for NROM technology that substantially can reduce poly depletion effect and equivalent oxide thickness in conventional process.

One object of the present invention is to provide a structure of fabricating high gate performance for NROM technology to improve gate oxide integrity in peripheral regions.

Another object of the present invention is to provide a structure of fabricating high gate performance for NROM technology to reduce poly depletion effect and equivalent oxide thickness.

One another object of the present invention is to provide a structure of fabricating high gate performance for NROM technology to improve active dopant concentration and yield.

In order to achieve the above object, the present invention provides a structure of fabricating high gate performance for NROM technology. The method at least includes the following steps. First of all, an tunnel oxide layer on the silicon substrate. The tunnel oxide layer has a thickness from about 120 angstroms to about 180 angstroms. Then, a amorphous silicon layer on the tunnel oxide layer, and a poly-SiGe layer (a polysilicon layer with doped germanium) on the amorphous silicon layer. The amorphous silicon layer is formed by using a low pressure chemical vapor deposition method. The amorphous silicon layer has a thickness from about 30 angstroms to about 60 angstroms. Next, an interpoly dielectric layer on the poly-SiGe layer. The interpoly dielectric layer comprises a first oxide layer, a nitride layer over the first oxide layer, and a second oxide layer over the nitride layer. Finally, a polysilicon layer on the interpoly dielectric layer.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sectional, two-dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

Figure 1A:
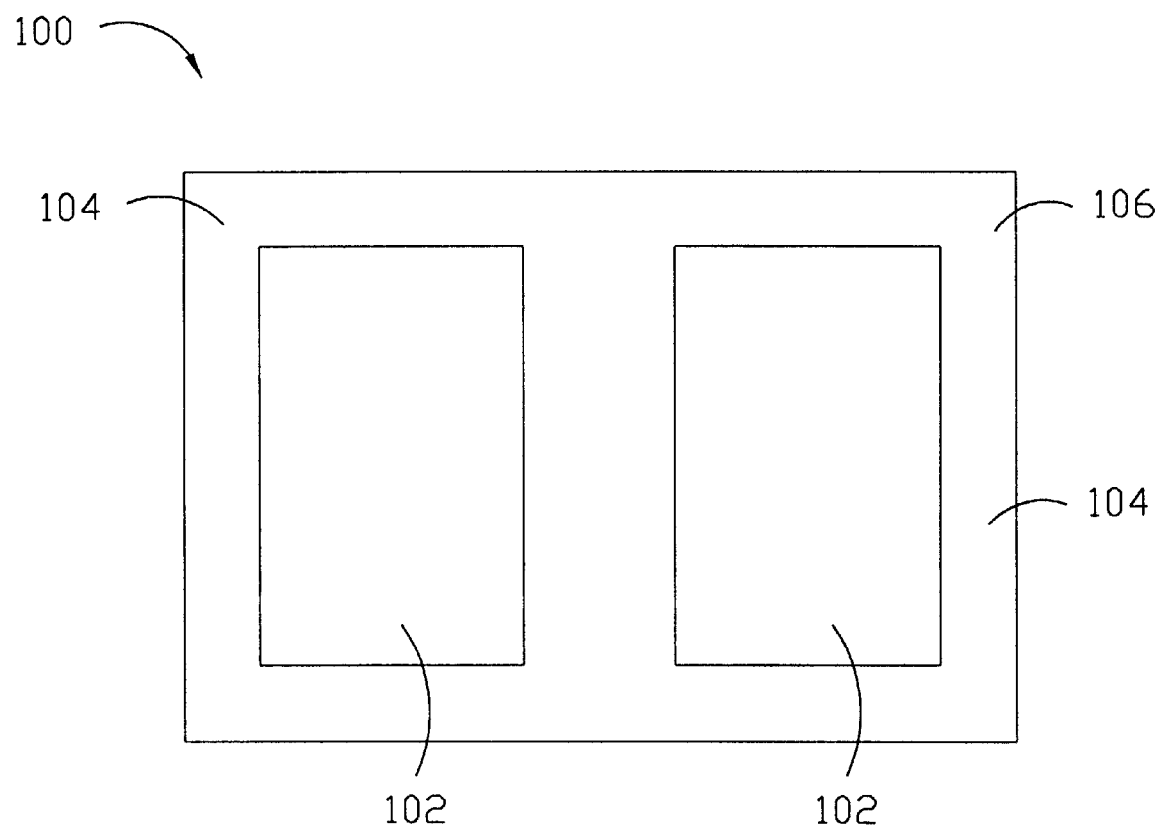
FIG. 1A is a plan view illustrating a prior art layout of a flash memory chip.
Figure 1B:
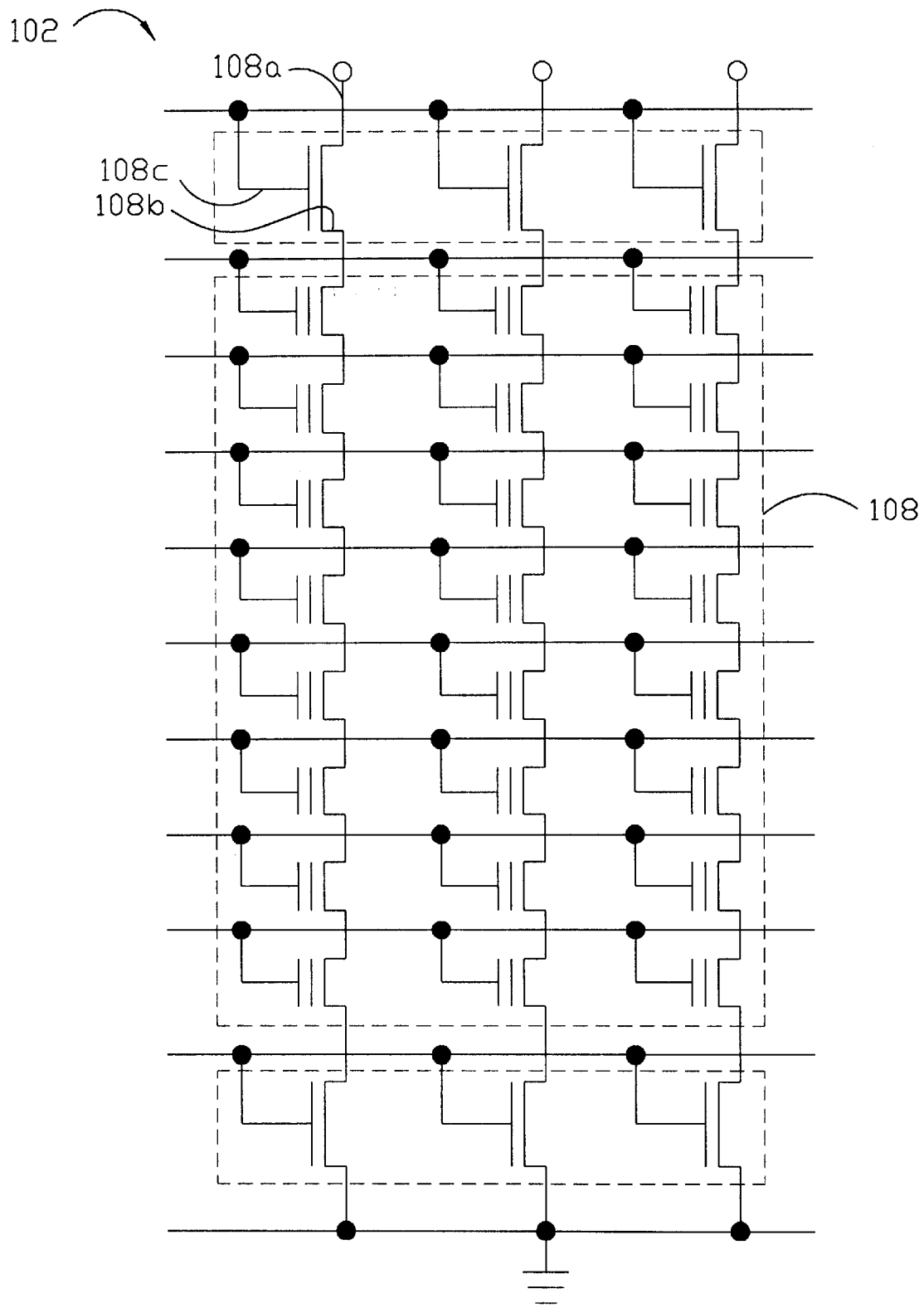
FIG. 1B is a schematic diagram illustrating a prior art NAND-type flash memory circuit configuration.
Figure 1C:
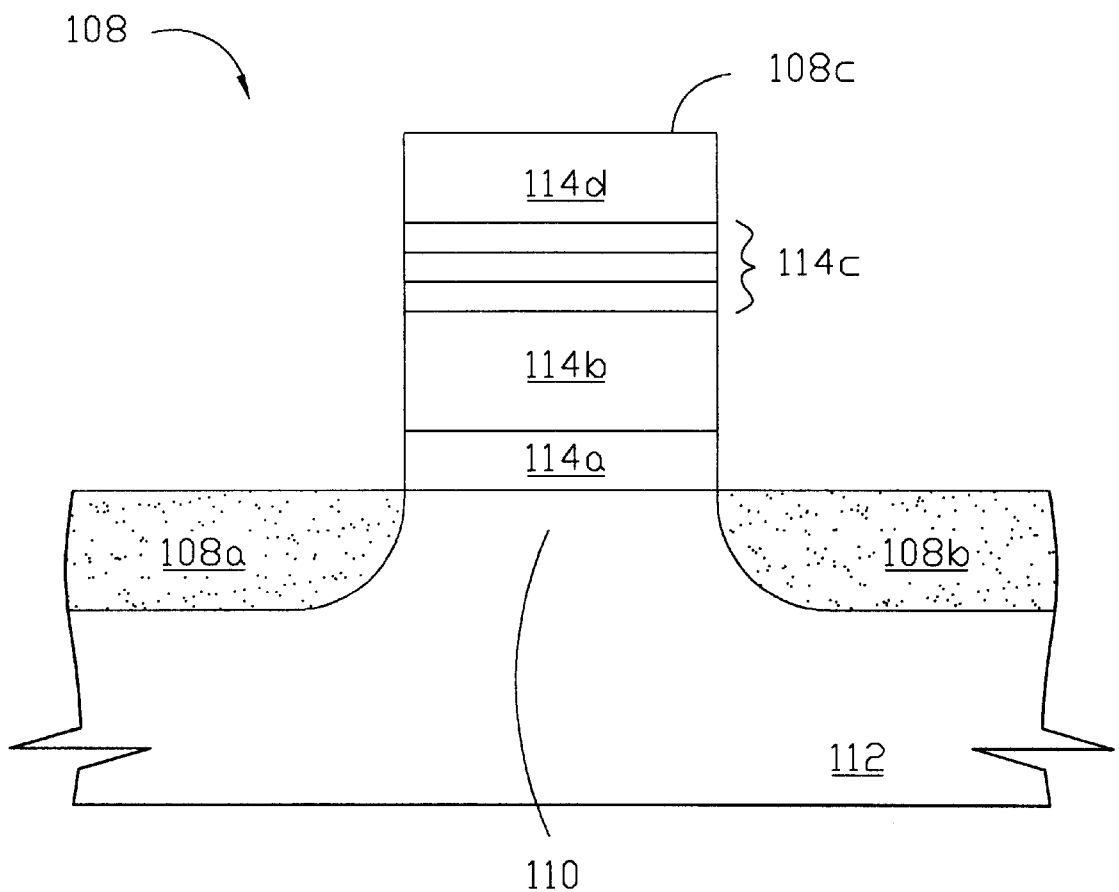
FIG. 1C is a fragmentary cross section illustrating a prior art stacked gate flash memory cell.
Figure 2A:
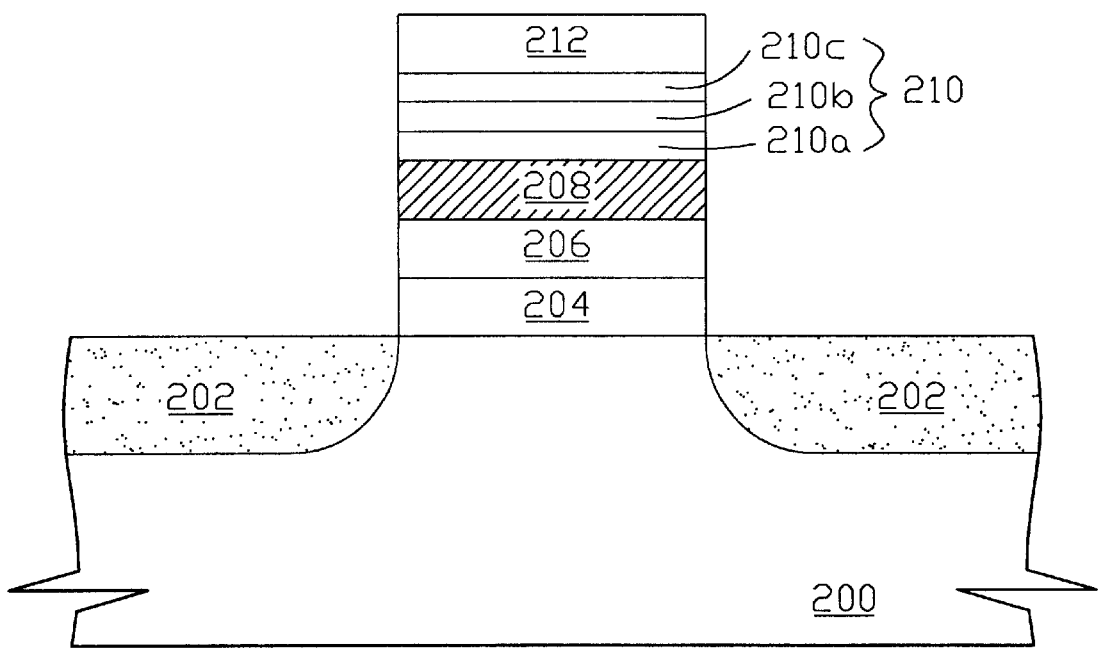
FIG. 2A are cross-sectional views of a structure of fabricating high gate performance for NROM technology in accordance with one preferred embodiment of the present invention.

Referring to FIG. 2A, a substrate 200 with the source/drain regions 202 formed therein is provided. A channel region (not shown in figure) is between the source/drain regions 202. A tunnel oxide layer 204 is formed on the channel region of the substrate 200. The tunnel oxide layer 204 has a thickness from about 120 angstroms to about 180 angstroms. Then, a first amorphous silicon 206 is formed on the tunnel oxide layer 204. The first amorphous silicon layer 206 is formed by using a low pressure chemical vapor deposition method. The first amorphous silicon layer 206 has a thickness from about 30 angstroms to about 60 angstroms. A first poly-SiGe layer 208 (a polysilicon layer with doped germanium) is formed on the first amorphous silicon layer 206. The first doped polysilicon layer is provided using an in situ doping process over the first amorphous silicon layer 206. In this embodiment, a germanium doped polysilicon layer is deposited via CVD to form a first poly-SiGe layer 208 between at 450° C. and 620° C., 150 mTorr and 350 mTorr. In the embodiment, temperature and pressure of this layer is preferable 530° C. and 200 mTorr. The first poly-SiGe layer 208 has a thickness of about 90 angstroms to about 100 angstroms. An interpoly dielectric layer 210 is formed on the first poly-SiGe 208. The interpoly dielectric layer 210 is an ONO multi-layer dielectric containing three layers; namely a first oxide layer 210a, a nitride layer 210b, and a second oxide layer 210c. The interpoly dielectric layer 210 has a thickness of about 130 angstroms. The first oxide layer 210a is deposited at a temperature of about 750° C. and a pressure of 600 mTorr low pressure CVD (LPCVD) on the first poly-SiGe 208. Nitride is next deposited at a temperature of about 760° C. under $NH_3$ at 600 cc, $SiH_2Cl_2$ at 100 cc and a pressure of 330 mTorr to form a nitride layer 210b. The nitride layer 210b is oxidized with wet oxygen at a temperature of about 950° C. to form second oxide layer 210c. A polysilicon layer 212 is formed on the interpoly dielectric layer 210. The structure can apply for the gate structure of conventional MOS.

Figure 2B:
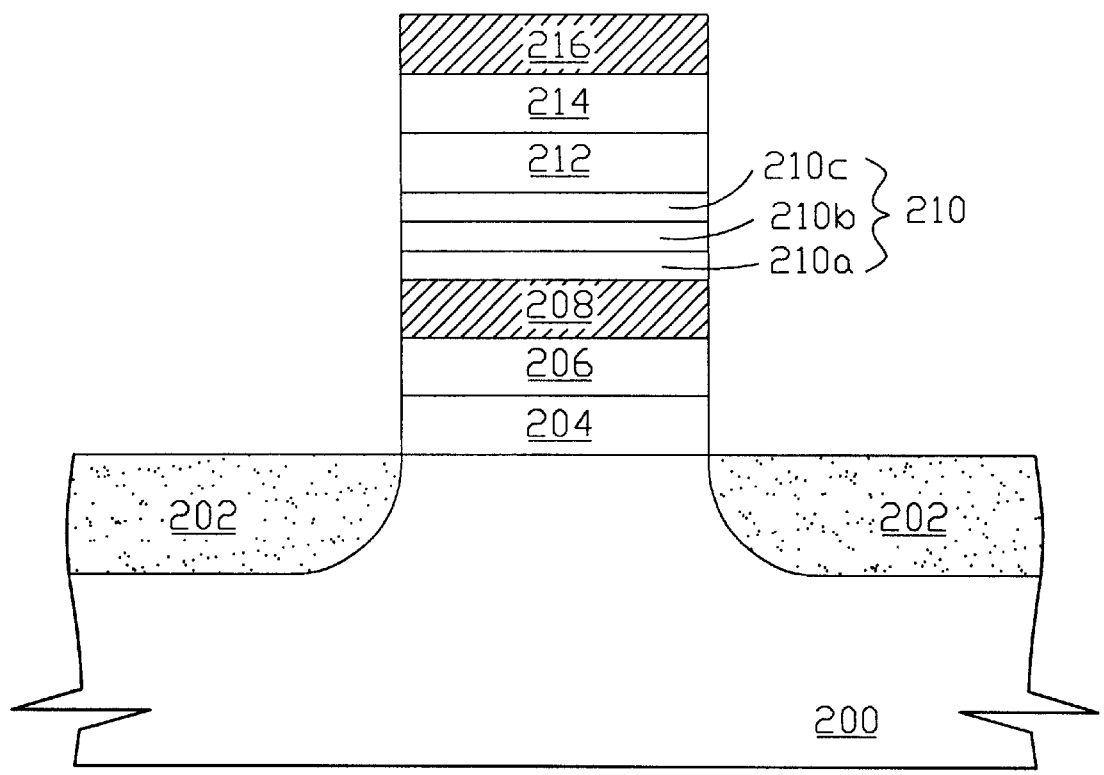
FIG. 2B are cross-sectional views of a structure of fabricating high gate performance for NROM technology in accordance with another preferred embodiment of the present invention.

Referring to FIG. 2B, this diagram shows the flash memory structure after partially deposition of the structure in FIG. 2A, wherein a second amorphous silicon layer 214, and second poly-SiGe layer 216 are sequentially formed thereon. This invention also can apply poly-SiGe layer and amorphous layer in the polysilicon control gate. The second amorphous silicon layer 214 is formed on the polysilicon layer 212. The second amorphous silicon layer 214 is formed by using a low pressure chemical vapor deposition method. The second amorphous silicon layer 214 has a thickness from about 30 angstroms to about 60 angstroms. A second poly-SiGe layer 216 (a polysilicon layer with doped germanium) is formed on the second amorphous silicon layer 214. The second doped polysilicon layer is provided using an in situ doping process over the second amorphous silicon layer 214. In this embodiment, a germanium doped polysilicon layer is deposited via CVD to form a second poly-SiGe layer 216 between at 450° C. and 620° C., 150 mTorr and 350 mTorr. In the embodiment, temperature and pressure of this layer is preferable 530° C. and 200 mTorr. The second poly-SiGe layer 216 has a thickness of about 90 angstroms to about 100 angstroms.

The structure of fabricating high gate performance for NROM technology using the above explained method, has the following advantages:

1. The present invention is to provide the structure of fabricating high gate performance for NROM technology to improve gate oxide integrity in peripheral regions.

2. The present invention is to provide a structure of fabricating high gate performance for NROM technology to reduce poly depletion effect and equivalent oxide thickness.

3. The present invention is to provide a structure of fabricating high gate performance for NROM technology to improve active dopant concentration and yield.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A gate structure on a silicon substrate, said gate structure comprising:
   a tunnel oxide layer on said silicon substrate;
   a first amorphous silicon layer on said tunnel oxide layer;
   a poly-SiGe layer on said first amorphous silicon layer;
   an interpoly dielectric layer on said poly-SiGe layer;
   a polysilicon layer on said interpoly dielectric layer;
   a second amorphous silicon layer on said polysilicon layer; and
   a second poly-SiGe layer on said second amorphous silicon layer.

2. The structure according to claim 1, wherein said first amorphous silicon layer has a thickness from about 30 angstroms to about 60 angstroms.

3. The structure according to claim 1, wherein said poly-SiGe layer is a polysilicon layer with doped germanium.

4. The structure according to claim 1, wherein said first Poly-SiGe layer has a thickness from about 90 angstroms to about 100 angstroms.

5. The structure according to claim 1, wherein said interpoly dielectric layer comprises a first oxide layer, a nitride layer over the first oxide layer, and a second oxide layer over the nitride layer.

6. The structure according to claim 1, wherein said second amorphous silicon layer has a thickness from about 30 angstroms to about 60 angstroms.

7. The structure according to claim 1, wherein said second Poly-SiGe layer has a thickness from about 90 angstroms to about 100 angstroms.

8. A gate structure on a silicon substrate, said gate structure comprising:
   a tunnel oxide layer on said silicon substrate;
   a first amorphous silicon layer on said tunnel oxide layer;
   a poly-SiGe layer on said first amorphous silicon layer;
   an interpoly dielectric layer on said poly-SiGe layer, wherein said interpoly dielectric layer is selected from the group consisting of first oxide layer, nitride layer, and second oxide layer;
   a polysilicon layer on said interpoly dielectric layer;
   a second amorphous silicon layer on said polysilicon layer; and
   a second poly-SiGe layer on said second amorphous silicon layer.

9. The structure according to claim 8, wherein said first amorphous silicon layer has a thickness from about 30 angstroms to about 60 angstroms.

10. The structure according to claim 8, wherein said poly-SiGe layer is a polysilicon layer with doped germanium.

11. The structure according to claim 8, wherein said first Poly-SiGe layer has a thickness from about 90 angstroms to about 100 angstroms.

12. The structure according to claim 8, wherein said second amorphous silicon layer has a thickness from about 30 angstroms to about 60 angstroms.

13. The structure according to claim 8, wherein said second Poly-SiGe layer has a thickness from about 90 angstroms to about 100 angstroms.

* * * * *